(12) United States Patent
Shirotori et al.

(10) Patent No.: US 9,196,273 B2
(45) Date of Patent: Nov. 24, 2015

(54) MAGNETORESISTIVE ELEMENT WITH THREE TERMINALS, MAGNETIC HEAD, AND MAGNETIC RECORDING AND REPRODUCING APPARATUS

(71) Applicant: KABUSHIKI KAISHA TOSHIBA, Tokyo (JP)

(72) Inventors: Satoshi Shirotori, Yokohama (JP); Yuuzo Kamiguchi, Yokohama (JP); Masayuki Takagishi, Kunitachi (JP); Shinobu Sugimura, Yokohama (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/338,466

(22) Filed: Jul. 23, 2014

(65) Prior Publication Data

US 2015/0030886 A1    Jan. 29, 2015

(30) Foreign Application Priority Data

Jul. 26, 2013  (JP) .................................. 2013-156034

(51) Int. Cl.
*G11B 5/39* (2006.01)

(52) U.S. Cl.
CPC .............. *G11B 5/398* (2013.01); *G11B 5/3909* (2013.01); *G11B 5/3912* (2013.01); *G11B 5/3929* (2013.01); *G11B 2005/3996* (2013.01)

(58) Field of Classification Search
USPC ....................................... 360/319, 322, 324.2
See application file for complete search history.

(56) References Cited

U.S. PATENT DOCUMENTS

| | | | | |
|---|---|---|---|---|
| 7,253,995 | B2* | 8/2007 | Takahashi et al. | 360/324.2 |
| 7,522,392 | B2* | 4/2009 | Carey et al. | 360/324.2 |
| 7,969,692 | B2* | 6/2011 | Takahashi | 360/324 |
| 8,085,513 | B2* | 12/2011 | Sasaki | 360/324.2 |
| 8,238,064 | B2 | 8/2012 | Yamada et al. | |
| 8,339,750 | B2* | 12/2012 | Sasaki | 360/319 |
| 8,351,249 | B2* | 1/2013 | Ishiwata et al. | 365/158 |
| 8,619,393 | B2* | 12/2013 | Stokes | 360/324 |
| 8,760,817 | B2* | 6/2014 | Boone et al. | 360/313 |
| 8,842,396 | B1* | 9/2014 | Zhu | 360/324.12 |
| 8,861,136 | B2* | 10/2014 | Sasaki et al. | 360/125.3 |
| 2006/0227466 | A1* | 10/2006 | Yagami | 360/324.2 |

FOREIGN PATENT DOCUMENTS

| | | |
|---|---|---|
| JP | 2009-146512 | 7/2009 |
| JP | 2011-104212 | 6/2011 |
| JP | 2012-234602 | 11/2012 |

* cited by examiner

*Primary Examiner* — Brian Miller
(74) *Attorney, Agent, or Firm* — Nixon & Vanderhye, P.C.

(57) ABSTRACT

An example magnetoresistive element includes a nonmagnetic conductive layer; a first magnetic layer connected to the nonmagnetic conductive layer; a second magnetic layer connected to the nonmagnetic conductive layer so as to be distant from the first magnetic layer; a third magnetic layer connected to the nonmagnetic conductive layer so as be distant from the first magnetic layer; and first to third magnetic electrodes connected to the first to third magnetic layers respectively. A voltage is applied between the third magnetic electrode and the first magnetic electrode through the third magnetic layer, the nonmagnetic conductive layer, and the first magnetic layer, and a current is caused to flow between the third electrode and the second magnetic electrode through the third magnetic layer, the nonmagnetic conductive layer, and the second magnetic layer. The nonmagnetic conductive layer decreases in volume toward the one end face.

7 Claims, 9 Drawing Sheets

MAGNETORESISTIVE ELEMENT WITH THREE TERMINALS, MAGNETIC HEAD, AND MAGNETIC RECORDING AND REPRODUCING APPARATUS

CROSS REFERENCE TO RELATED APPLICATIONS

This application is based upon and claims the benefit of priority from the prior Japanese Patent Application No. 2013-156034, filed on Jul. 26, 2013, the entire contents of which are incorporated herein by reference.

FIELD

Embodiments described herein relate generally to magnetoresistive elements, magnetic heads and magnetic recording and reproducing apparatuses.

BACKGROUND

The recording density of magnetic recording and reproducing apparatuses is expected to reach the order of Tbits/inch$^2$ by the development of perpendicular magnetic recording methods and magnetic head techniques using current perpendicular to plane giant magnetoresistance ("CPP-GMR") elements, or tunneling magnetoresistance ("TMR") elements. However, such a high recording density would not be easily achieved by using the aforementioned magnetic head techniques since narrowing the gap between shields of magnetoresistive elements serving as reproducing elements is difficult due to many layers included therein such as antiferromagnetic layers, magnetization pinned layers, nonmagnetic layer, and magnetization free layers.

Reproducing heads using a spin accumulation effect are proposed to narrow the gap between shields. In a reproducing head using a spin accumulation effect, a magnetization pinned layer and an antiferromagnetic layer are disposed to be recessed from a surface facing a recording disk (air bearing surface ("ABS")), a sense current is caused to flow through the magnetization pinned layer to transfer, through a nonmagnetic layer, spin-polarized electrons to a magnetization free layer at the ABS, and a non-local voltage measurement is performed at the magnetization free layer with no current flowing therethrough. Since the magnetization pinned layer and the antiferromagnetic layer are recessed from the ABS, the gap between shields can be narrowed, and a magnetoresistance effect can be obtained.

In order to achieve reproducing heads using the spin accumulation effect, the output voltage should be increased. However, the current density is said to have a limit of about $1 \times 10^7$ A/cm$^2$. In order to improve the sense current, the thickness of the nonmagnetic layer should be maintained at a certain level. On other hand, in order to improve the recording density, the gap between shields should be narrowed further. Therefore, the structure for narrowing the gap between shields without reducing the output voltage is important.

DETAILED DESCRIPTION

A magnetoresistive element according to an embodiment includes: a nonmagnetic conductive layer having two end faces in a direction along which the nonmagnetic conductive layer extends; a first magnetic layer connected to the nonmagnetic conductive layer near one end face of the two end faces; a second magnetic layer connected to the nonmagnetic conductive layer so as to be distant from the first magnetic layer in the direction; a third magnetic layer connected to the nonmagnetic conductive layer so as be distant from the first magnetic layer in the direction; a first magnetic electrode connected to the first magnetic layer; a second magnetic electrode connected to the second magnetic layer; and a third magnetic electrode connected to the third magnetic layer, a voltage being applied between the third magnetic electrode and the first magnetic electrode through the third magnetic layer, the nonmagnetic conductive layer, and the first magnetic layer, and a current being caused to flow between the third electrode and the second magnetic electrode through the third magnetic layer, the nonmagnetic conductive layer, and the second magnetic layer, the nonmagnetic conductive layer decreasing in volume toward the one end face.

Embodiments will now be explained with reference to the accompanying drawings.

First Embodiment

Figure 1:
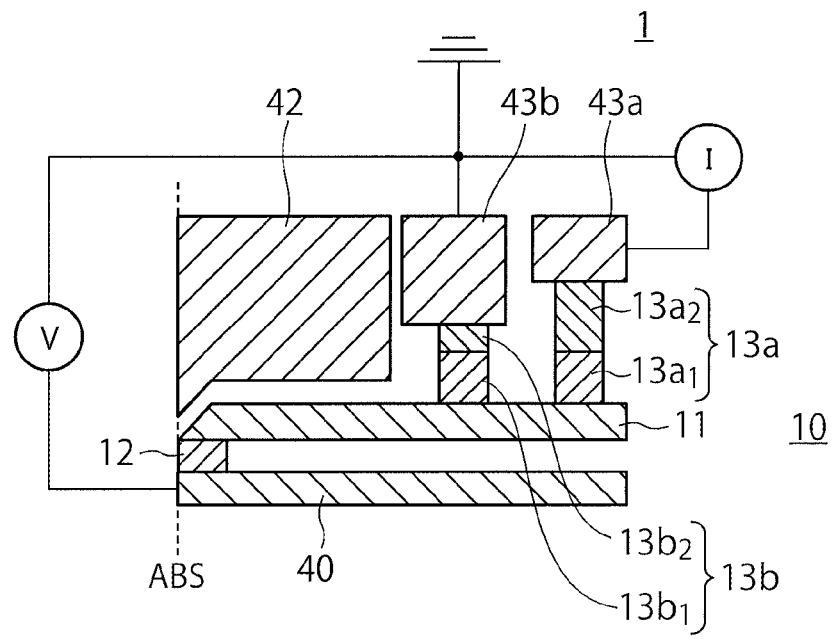
FIG. 1 is a cross-sectional view showing a magnetic head according to a first embodiment.

FIG. 1 shows a magnetic head according to a first embodiment. FIG. 1 is a cross-sectional view of a magnetic head 1 according to the first embodiment sectioned along a plane perpendicular to the air bearing surface ("ABS"), and to a direction along which the magnetic head advances. The magnetic head 1 according to the first embodiment includes a magnetoresistive element 10 to serve as a reproducing element, magnetic shields 40, 42, and magnetic shields 43a, 43b.

The magnetoresistive element 10 includes a nonmagnetic conductive layer 11, a magnetic layer 12 in which the magnetization direction is switchable, and magnetic layers 13a, 13b each including a magnetic film in which the magnetization direction is pinned. The volume of the nonmagnetic conductive layer 11 decreases toward the ABS. Specifically, the thickness of the nonmagnetic conductive layer 11 is reduced toward the ABS, or the nonmagnetic conductive layer 11 is recessed from the ABS.

The magnetic layer 12 is disposed on and connected to the nonmagnetic conductive layer 11 near the ABS, and the magnetization direction of the magnetic layer 12 is variable in response to an external magnetic field, e.g., an external magnetic field from a magnetic recording medium. The magnetic layers 13a, 13b are disposed on and connected to the nonmagnetic conductive layer 11 on the opposite side to the magnetic layer 12 and at a distance from the magnetic layer 12. The magnetic layers 13a, 13b are disposed to be separated from each other. The magnetic layer 13a is disposed to be more distant from the magnetic layer 12 than the magnetic layer 13b. The magnetic layer 13a has a multilayer structure including a magnetic film $13a_1$ in which the magnetization direction is pinned, and an antiferromagnetic film $13a_2$ for pinning the magnetization direction of the magnetic film $13a_1$ to one direction. The magnetic film $13a_1$ is disposed between the nonmagnetic conductive layer 11 and the antiferromagnetic film $13a_2$, and electrically connected to the nonmagnetic conductive layer 11. The magnetic layer 13b has a multilayer structure including a magnetic film $13b_1$ in which the magnetization direction is pinned, and an antiferromagnetic film $13b_2$ for pinning the magnetization direction of the magnetic film $13b_1$ to one direction. The magnetization direction of the magnetic film $13a_1$ and the magnetization direction of the magnetic film $13b_1$ are antiparallel to (opposite to) each other. The magnetic film $13b_1$ is disposed between the nonmagnetic conductive layer 11 and the antiferromagnetic film $13b_2$, and connected to the nonmagnetic conductive layer 11. Although the magnetic films $13a_1$, $13b_1$ are in contact with the nonmagnetic conductive layer 11 in the first embodiment, a nonmagnetic conductive film or tunnel insulating film (not shown in FIG. 1) may be disposed between the magnetic films $13a_1$, $13b_1$ and the nonmagnetic conductive layer 11.

The magnetic shield 40 is disposed on the opposite side of the magnetic layer 12 to the nonmagnetic conductive layer 11. The magnetic shield 42 is disposed on the opposite side of the magnetic layer 12 and the nonmagnetic conductive layer 11 to the magnetic shield 40. Near the ABS, the magnetic shield 42 projects toward the magnetic shield 40 side in accordance with the shape of the nonmagnetic conductive layer 11. This makes the distance between the magnetic shield 40 and the magnetic shield 42 at the ABS, i.e., the magnetic gap, narrower, thereby improving the resolution.

The magnetic shield 43a connects to the magnetic layer 13a. In the first embodiment, it connects to the antiferromagnetic film $13a_2$. The magnetic shield 43b connects to the magnetic layer 13b. The magnetic shield 40, the magnetic layer 12, the magnetic shield 42, and the magnetic shields 43a, 43b of the first embodiment form a magnetic circuit.

Next, the operation of the magnetic head according to the first embodiment will be described below. Incidentally, in the first embodiment, the magnetic shield 43b is grounded. First, a current is caused to flow from the magnetic shield 43a to the magnetic shield 43b through the magnetic layer 13a, the nonmagnetic conductive layer 11, and the magnetic layer 13b. At this time, electrons flow to the magnetic layer 13b through the magnetic shield 43b. The electrons passing through the magnetic layer 13b are spin-polarized, and flow into the magnetic layer 13a through the nonmagnetic conductive layer 11. Electrons spin-polarized in the same direction as the magnetization direction of the magnetic film $13a_1$ of the magnetic layer 13a pass through the magnetic layer 13a, and electrons spin-polarized in a direction opposite to (antiparallel to) the magnetization direction of the magnetic film $13a_1$ of the magnetic layer 13a are reflected at the interface between the magnetic film $13a_1$ and the nonmagnetic conductive layer 11, and accumulated in the nonmagnetic conductive layer 11. The spin-polarized electrons are accumulated within the range of the spin diffusion length during the period the current is flowing through the nonmagnetic conductive layer, and the nonmagnetic conductive layer 11 acts like a ferromagnetic member. This phenomenon is called "spin accumulation effect."

The voltage between the magnetic shield 40 and the magnetic shield 43b becomes higher when spin-polarized electrons are accumulated in the nonmagnetic conductive layer 11 than when no spin-polarized electron is accumulated in the nonmagnetic conductive layer 11. The voltage between the magnetic shield 40 and the magnetic shield 43b when spin-polarized electrons are accumulated in the nonmagnetic conductive layer 11 varies in accordance with the angle between the magnetization direction of the magnetic layer 12 and the magnetization direction of the magnetic film 13b, i.e., the magnetization direction of the magnetic layer 12. The magnetization direction of the magnetic layer 12 varies in response to the magnetic field from a magnetic recording medium disposed to face the ABS of the magnetic head 1, i.e., the magnetization direction recorded in the magnetic recording medium. The voltage between the magnetic shield 40 and the magnetic shield 43b corresponds to the output of the magnetic head 1. Therefore, the output of the magnetic head 1 varies in response to the information stored in the magnetic recording medium, and increases due to the spin-polarized electrons accumulated in the nonmagnetic conductive layer 11.

The distance in the nonmagnetic conductive layer 11 between the magnetic layer 13b through which the spin-polarized electrons flow into the nonmagnetic conductive layer 11 and the magnetic layer 12 for detecting the voltage is preferably within the spin diffusion length. This structure allows the spin-polarized electrons to be accumulated in the nonmagnetic conductive layer 11 between the magnetic layer 13b and the magnetic layer 12, to increase the voltage between the magnetic shield 40 and the magnetic shield 43b.

The magnetic head according to the first embodiment has a three-terminal structure in which the magnetic shield 40 and the magnetic shields 43a, 43b serve as terminals via the magnetic layers. In this three-terminal structure, all the terminals are formed of magnetic materials. The spin diffusion length in a magnetic material is considerably shorter than that in a nonmagnetic material. Since all the terminals of the first embodiment are formed of magnetic materials, the dimensions of the magnetic head can be considerably downsized. Furthermore, since the first embodiment does not include any nonmagnetic terminal, the spin accumulation effect can be concentrated in a small nonmagnetic conductive layer 11. This can prevent leakage of spin-polarized electrons from the nonmagnetic terminal. Therefore, a large output can be obtained.

As described above, according to the first embodiment, a magnetoresistive element and a magnetic head can be obtained, in which the output voltage can be increased and the gap between shields can be narrowed.

Second Embodiment

Figure 2:
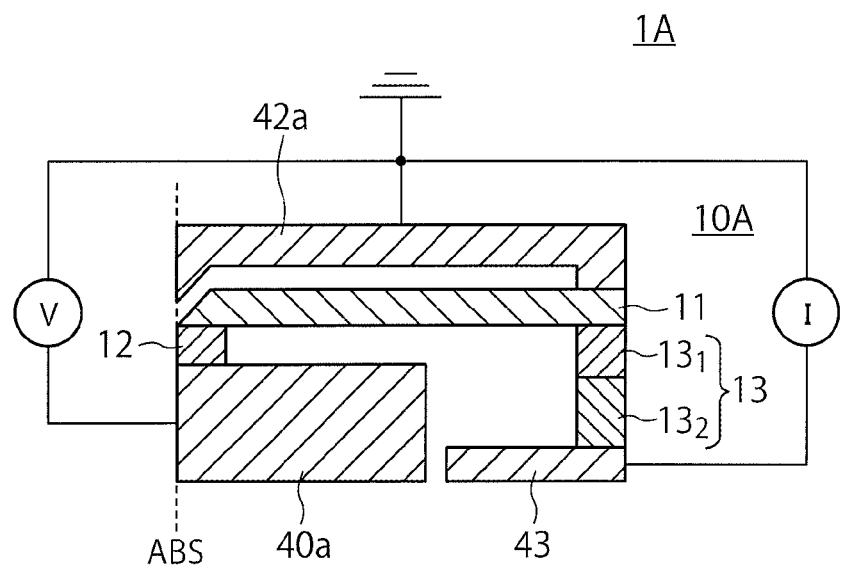
FIG. 2 is a cross-sectional view showing a magnetic head according to a second embodiment.

FIG. 2 shows a magnetic head according to a second embodiment. FIG. 2 is a cross-sectional view of a magnetic head 1A of the second embodiment sectioned along a plane perpendicular to the ABS and to a direction in which the magnetic head advances. The magnetic head 1A according to the second embodiment includes a magnetoresistive element 10A to serve as a reproducing element, a magnetic shield 40a, a magnetic shield 42a, and a magnetic shield 43.

The magnetoresistive element 10A includes a nonmagnetic conductive layer 11, a magnetic layer 12 in which the magnetization direction is variable, and a magnetic layer 13 including a magnetic film in which the magnetization direction is pinned. As in the case of the first embodiment, the nonmagnetic conductive layer 11 is shaped to have a reduced volume toward the ABS. Specifically, the thickness of the nonmagnetic conductive layer 11 is reduced toward the ABS, or the nonmagnetic conductive layer 11 is recessed from the ABS.

As in the case of the first embodiment, the magnetic layer 12 is disposed on and connected to the nonmagnetic conductive layer 11 near the ABS, and the magnetization direction of the magnetic layer 12 varies in response to an external magnetic field, e.g., a magnetic field from a magnetic recording medium. The magnetic layer 13 is disposed on the same side as the magnetic layer 12 on the nonmagnetic conductive layer 11 so as to be separated from the magnetic layer 12, and connected to the nonmagnetic conductive layer 11. The magnetic layer 13 has a multilayer structure including a magnetic film $13_1$ in which the magnetization direction is pinned, and an antiferromagnetic film $13_2$ for pinning the magnetization direction of the magnetic film $13_1$ to one direction. The magnetic film $13_1$ is disposed between the nonmagnetic conductive layer 11 and the antiferromagnetic film $13_2$, and connected to the nonmagnetic conductive layer 11. Although the magnetic film $13_1$ is in contact with the nonmagnetic conductive layer 11 in the second embodiment, a nonmagnetic conductive film or tunnel insulating film (not shown in FIG. 2) may be disposed between the magnetic film $13_1$ and the nonmagnetic conductive layer 11.

The magnetic shield 40a is disposed on the opposite side of the magnetic layer 12 to the nonmagnetic conductive layer 11. The magnetic shield 42a is disposed on the opposite side of the magnetic layer 12 and the nonmagnetic conductive layer 11 to the magnetic shield 40a. In accordance with the shape of the nonmagnetic conductive layer 11 near the ABS, the magnetic shield 42a projects toward the magnetic shield 40a side near the ABS. As a result, the distance between the magnetic shield 40a and the magnetic shield 42a at the ABS, i.e., the magnetic gap, can be narrowed, and the resolution can be improved. The magnetic shield 42a connects to the nonmagnetic conductive layer 11 at the terminal opposite to the ABS.

The magnetic shield 43 is electrically connected to the magnetic layer 13, but electrically isolated from the magnetic shield 40a. In the second embodiment, the magnetic shield 40a, the magnetic layer 12, the magnetic shield 42a, the magnetic layer 13, and the magnetic shield 43 form a magnetic circuit.

Next, the operation of the magnetic head according to the second embodiment will be described below. In the second embodiment, the magnetic shield 42a is grounded. First, a current is caused to flow from the magnetic shield 43 to the magnetic shield 42a through the magnetic layer 13 and the nonmagnetic conductive layer 11. As a result, electrons flow from the magnetic shield 42a to the magnetic layer 13. The electrons passing through the magnetic shield 42a flow into the magnetic layer 13 through the nonmagnetic conductive layer 11. Electrons with spin in the same direction as the magnetization direction of the magnetic film $13_1$ of the magnetic layer 13 pass through the magnetic layer 13, and electrons with spin antiparallel to the magnetization direction of the magnetic film $13_1$ of the magnetic layer 13 are reflected at the interface between the magnetic film $13_1$ and the nonmagnetic conductive layer 11 and accumulated in the nonmagnetic conductive layer 11. As a result, spin-polarized electrons are accumulated in the nonmagnetic conductive layer 11, and the nonmagnetic conductive layer 11 acts like a ferromagnetic member (spin accumulation effect).

As described with respect to the first embodiment, the voltage between the magnetic shield 40a and the magnetic shield 42a when spin-polarized electrons are accumulated in the nonmagnetic conductive layer 11 becomes higher than when no spin-polarized electron is accumulated. Furthermore, as in the case of the first embodiment, the output of the magnetic head 1A varies in accordance with information recorded in a magnetic recording medium, and increased by the spin-polarized electrons accumulated in the nonmagnetic conductive layer.

The distance in the nonmagnetic conductive layer 11 between the magnetic layer 13 for introducing spin-polarized electrons into the nonmagnetic conductive layer 11 and the magnetic layer 12 for detecting voltage is preferably within the spin diffusion length. With such a structure, spin-polarized electrons are accumulated in the nonmagnetic conductive layer 11 between the magnetic layer 13 and the magnetic layer 12, thereby increasing the voltage between the magnetic shield 40a and the magnetic shield 42a.

The magnetic head according to the second embodiment has a three-terminal structure in which the magnetic shield 40a and the magnetic shield 43 serve as terminals including magnetic layers, and the magnetic shield 42a serves as a terminal including the nonmagnetic conductive layer 11. This means that not all the terminals in the three-terminal structure are formed of magnetic materials. This structure leads to a reduced output voltage as compared to the first embodiment due to leakage of spin-polarized electrons from the terminal including the nonmagnetic layer. However, as compared to a magnetic head in which the nonmagnetic conductive layer 11 does not decrease in volume toward the ABS, the gap between the shields of the second embodiment is reduced, like that of the first embodiment, without reducing the output voltage.

As described above, according to the second embodiment, a magnetoresistive element and a magnetic head capable of narrowing the gap between shields without reducing output voltage can be provided.

Third Embodiment

Figure 3:
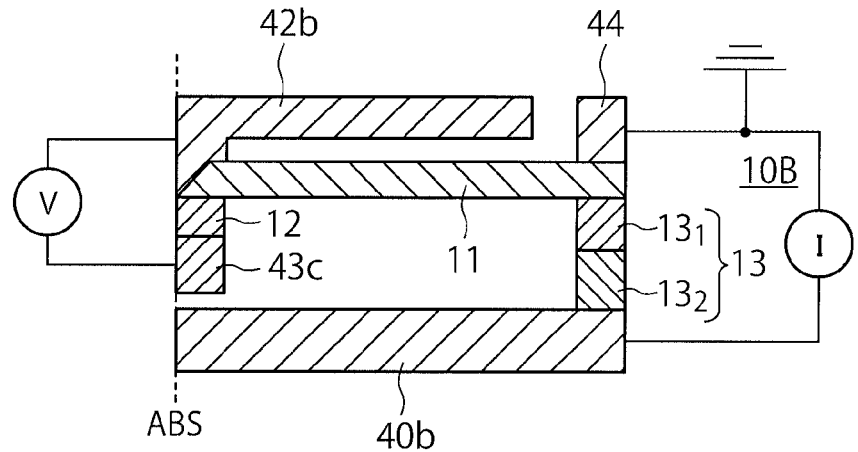
FIG. 3 is a cross-sectional view showing a magnetic head according to a third embodiment.

FIG. 3 shows a magnetic head according to a third embodiment. FIG. 3 is a cross-sectional view of a magnetic head 1B according to the third embodiment sectioned along a plane perpendicular to the ABS and to the direction along which the magnetic head advances. The magnetic head 1B according to the third embodiment includes a magnetoresistive element 10B to serve as a reproducing element, a magnetic shield 40b, a magnetic shield 42b, a magnetic shield 43c, and a magnetic shield 44.

The magnetoresistive element 10B includes a nonmagnetic conductive layer 11, a magnetic layer 12 in which the magnetization direction is variable, and a magnetic layer 13 including a magnetic film in which the magnetization direction is pinned. As in the case of the first embodiment, the volume of the nonmagnetic conductive layer 11 decreases toward the ABS. Specifically, the thickness of the nonmagnetic conductive layer 11 is reduced toward the ABS, or the nonmagnetic conductive layer 11 is recessed from the ABS.

As in the case of the first embodiment, the magnetic layer 12 is disposed on and connected to the nonmagnetic conductive layer 11 near the ABS, and the magnetization direction of the magnetic layer 12 is variable in response to an external magnetic field, e.g., a magnetic field from a magnetic recording medium. The magnetic layer 13 is disposed on and connected to the nonmagnetic conductive layer 11 on the opposite side to the magnetic layer 12 so as to be at a distance from the magnetic layer 12. The magnetic layer 13 has a multilayer structure in which a magnetic film $13_1$, in which the magnetization direction is pinned, and an antiferromagnetic film $13_2$ for pinning the magnetization direction of the magnetic film $13_1$ to one direction are stacked. The magnetic film $13_1$ is disposed between the nonmagnetic conductive layer 11 and the antiferromagnetic film $13_2$, and connected to the nonmagnetic conductive layer 11. Although the magnetic film $13_1$ is in contact with the nonmagnetic conductive layer 11 in the second embodiment, a nonmagnetic conductive film or a tunnel insulating film (not shown in FIG. 3) may be disposed between the magnetic film $13_1$ and the nonmagnetic conductive layer 11.

The magnetic shield 40b is disposed on the opposite side of the magnetic layer 12 to the nonmagnetic conductive layer 11. The magnetic shield 40b is connected to the magnetic layer 13, i.e., the antiferromagnetic film $13_2$, at the opposite terminal to the ABS. The magnetic shield 43c is disposed between the magnetic shield 40b and the magnetic layer 12, and electrically isolated from the magnetic shield 40b. The magnetic shield 42b is disposed on the opposite side of the magnetic layer 12 and the nonmagnetic conductive layer 11 to the magnetic shield 43c, and to the magnetic shield 40b. The magnetic shield 44 is disposed on the same side of the nonmagnetic conductive layer 11 as the magnetic shield 42b, and connected to the nonmagnetic conductive layer 11. A portion of the magnetic shield 42b near the ABS projects toward the magnetic shield 43c in accordance with the shape of the nonmagnetic conductive layer 11 near the ABS. This structure allows the distance between the magnetic shield 40b and the magnetic shield 42b near the ABS, i.e., the magnetic gap, to become narrower to improve the resolution.

In the third embodiment, the magnetic shield 40b, the magnetic shield 43c, the magnetic layer 12, the magnetic shield 42b, the magnetic shield 44, and the magnetic layer 13 form a magnetic circuit.

Next, the operation of the magnetic head according to the third embodiment will be described. In the third embodiment, the nonmagnetic conductive layer 11 is grounded. First, a current is caused to flow from the magnetic shield 40b to the magnetic shield 44 through the magnetic layer 13. Then, electrons flow from the magnetic shield 44 to the magnetic layer 13. Electrons having a spin in the same direction as the magnetization direction of the magnetic film $13_1$ of the magnetic layer 13 flow through the magnetic layer 13, and electrons having a spin in the opposite direction (antiparallel direction) to the magnetization direction of the magnetic film $13_1$ of the magnetic layer 13 are reflected at the interface between the magnetic film $13_1$ and the nonmagnetic conductive layer 11, and accumulated in the nonmagnetic conductive layer 11. Thus, spin-polarized electrons are accumulated in the nonmagnetic conductive layer 11, and the nonmagnetic conductive layer 11 acts like a ferromagnetic member (spin accumulation effect).

As described in the descriptions of the first embodiment, the voltage between the magnetic shield 43c and the magnetic shield 42b becomes higher when the spin-polarized electrons are accumulated in the nonmagnetic conductive layer 11 than when no spin-polarized electron is accumulated in the nonmagnetic conductive layer 11. Furthermore, as in the case of the first embodiment, the output of the magnetic head 1B varies in accordance with the information stored in a magnetic recording medium, the output increasing due to the spin-polarized electrons accumulated in the nonmagnetic conductive layer 11.

The distance in the nonmagnetic conductive layer 11 between the magnetic layer 13, which introduces spin-polarized electrons to the nonmagnetic conductive layer 11, and the magnetic layer 12 for detecting voltage is preferably within the spin diffusion length. Such a structure helps the spin-polarized electrons to be accumulated in the nonmagnetic conductive layer 11 between the magnetic layer 13 and the magnetic layer 12, thereby increasing the voltage between the magnetic shield 43c and the magnetic shield 42b. As a result, the output voltage can be increased.

The magnetic head according to the third embodiment has a four-terminal structure in which each of the magnetic shield 40b including a magnetic layer, the magnetic shield 43c, the magnetic shield 42b with the nonmagnetic conductive layer 11, and the magnetic shield 44 serves as a terminal.

As described above, the magnetic head according to the third embodiment outputs a reduced voltage as compared to the magnetic head according to the first embodiment due to leakage of spin-polarized electrons from the terminal with the nonmagnetic layer, and has an increased gap between the shields since the number of terminals increases to four. However, the magnetoresistive element and the magnetic head according to the third embodiment have a reduced gap between the shields with the output voltage being maintained as compared to the magnetoresistive element and the magnetic head in which the nonmagnetic conductive layer 11 does not decrease in volume toward the ABS.

Any of the aforementioned structures maintains the output voltage and has a narrower gap between shields. This is obtained by decreasing the volume of the nonmagnetic conductive layer 11 toward the ABS. However, a three-terminal structure with all the terminals formed of magnetic materials is more preferable since such a structure can increase the output voltage.

Furthermore, in any of the aforementioned structures, the magnetic layers 12, 13 are in contact with the nonmagnetic conductive layer 11, regardless of whether they are on the same side or the opposite sides of the nonmagnetic conductive layer 11. Both the sides may provide the same effect.

Next, the nonmagnetic conductive layer 11 used in the magnetic head according to any of the first to the third embodiments will be described.

A nonmagnetic metal containing, for example, at least one element selected from the group consisting of Cu, Au, Ag, Al, Ru, and Ir can be used to form the nonmagnetic conductive layer 11. As described above, the nonmagnetic conductive layer 11 decreases in volume toward the ABS in order to narrow the distance between magnetic shields. Specifically, the thickness of the nonmagnetic conductive layer 11 is reduced toward the ABS, or the nonmagnetic conductive layer 11 is recessed from the ABS.

Specific examples of the shape of the nonmagnetic conductive layer 11 near the ABS will be described with reference to FIGS. 4(a) to 4(f). The nonmagnetic conductive layer 11 is in contact with at least one of a first surface 12a of the magnetic layer 12 on the opposite side to the ABS, and a second surface 12b of the magnetic layer 12, which is different from the first surface 12a and the ABS. Furthermore, the nonmagnetic conductive layer 11 decreases in volume toward the ABS.

Figure 4:
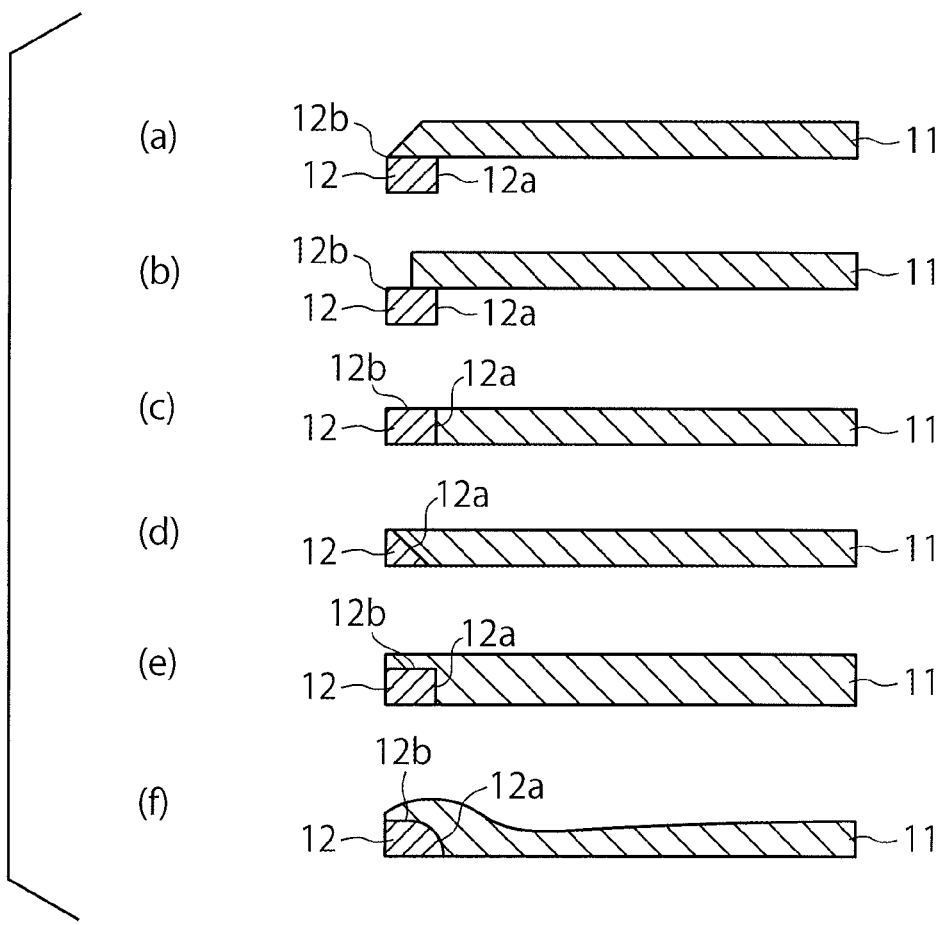
FIGS. 4(a) to 4(f) are cross-sectional views showing specific examples of nonmagnetic conductive layers included in the first to the third embodiments.
Figure 5:
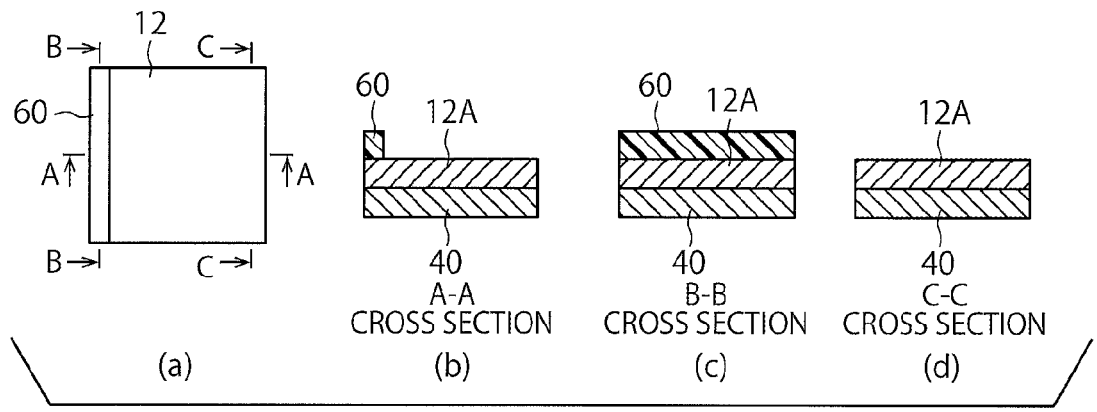
FIGS. 5(a) to 5(d) are diagrams showing a method of manufacturing a magnetic head according to a fourth embodiment.
Figure 6:
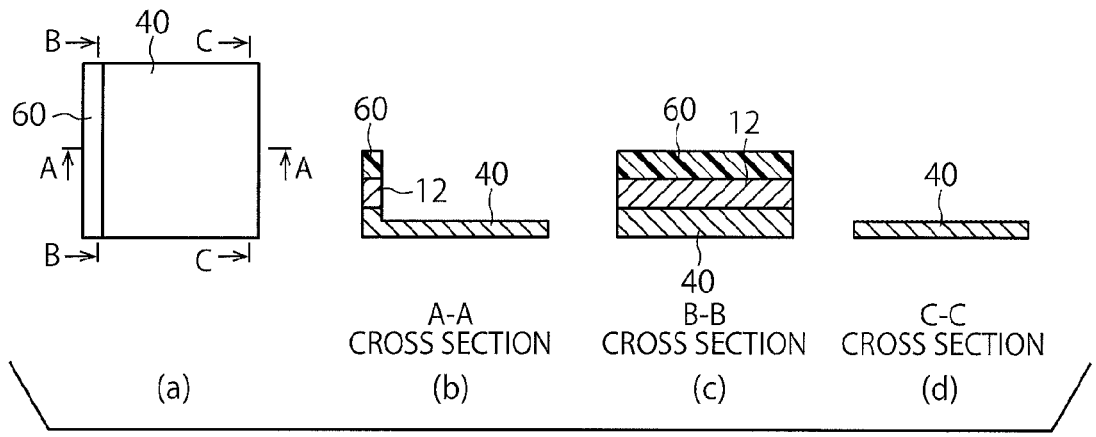
FIGS. 6(a) to 6(d) are diagrams showing the method of manufacturing a magnetic head according to the fourth embodiment.
Figure 7:
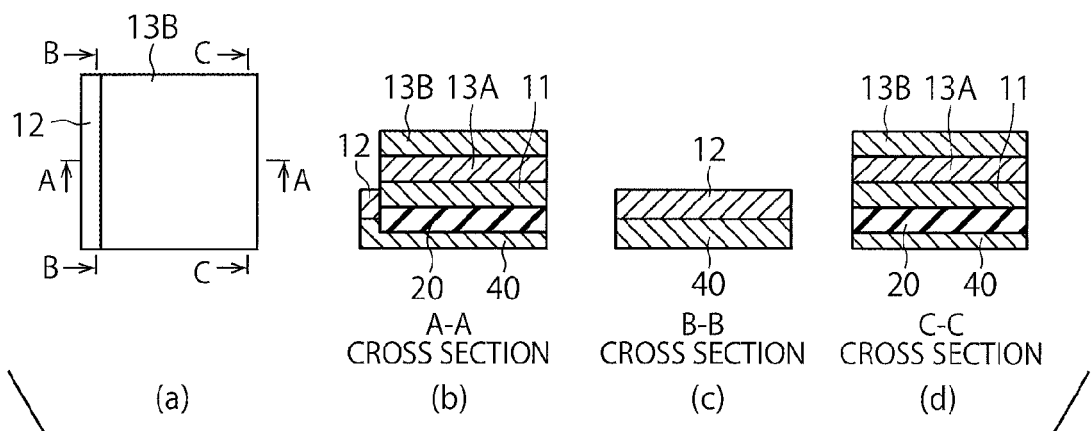
FIGS. 7(a) to 7(d) are diagrams showing the method of manufacturing a magnetic head according to the fourth embodiment.
Figure 8:
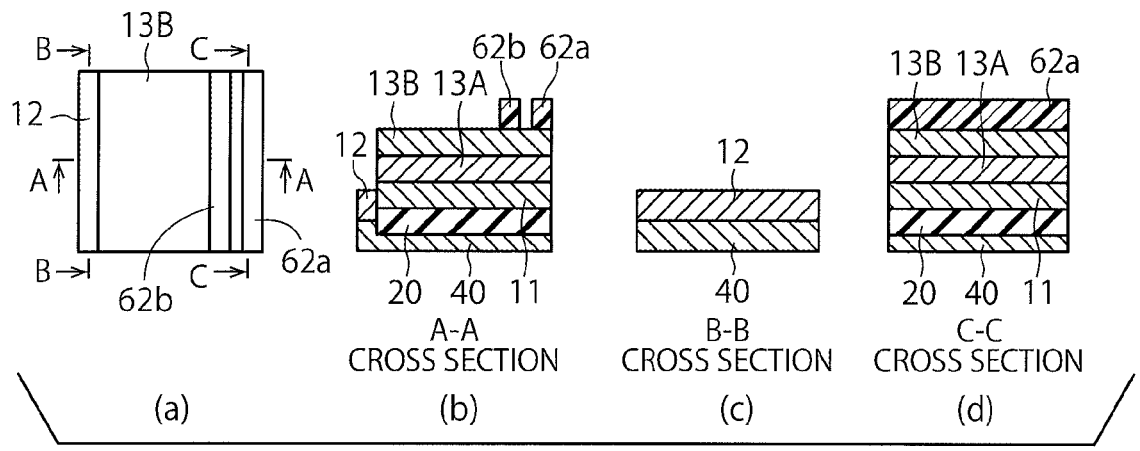
FIGS. 8(a) to 8(d) are diagrams showing the method of manufacturing a magnetic head according to the fourth embodiment.
Figure 9:
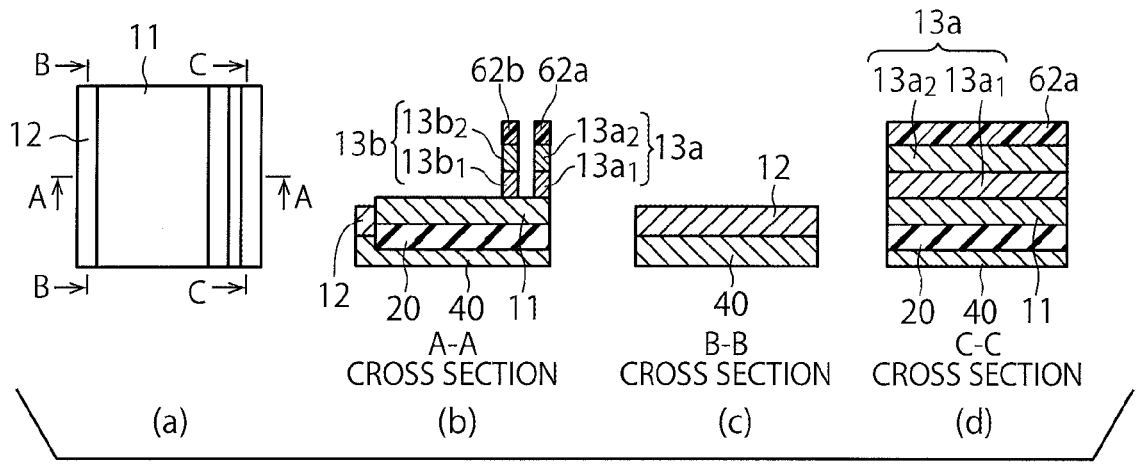
FIGS. 9(a) to 9(d) are diagrams showing the method of manufacturing a magnetic head according to the fourth embodiment.
Figure 10:
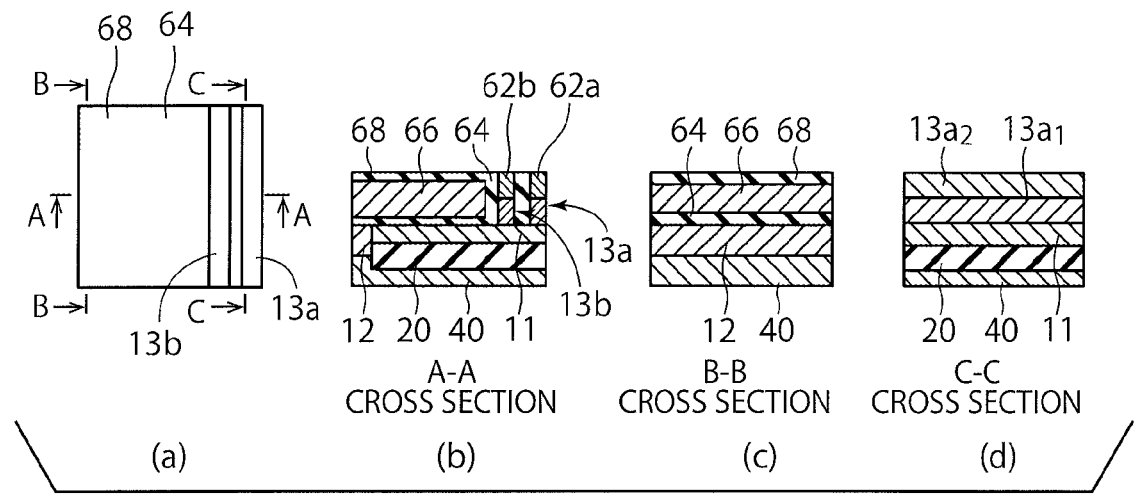
FIGS. 10(a) to 10(d) are diagrams showing the method of manufacturing a magnetic head according to the fourth embodiment.
Figure 11:
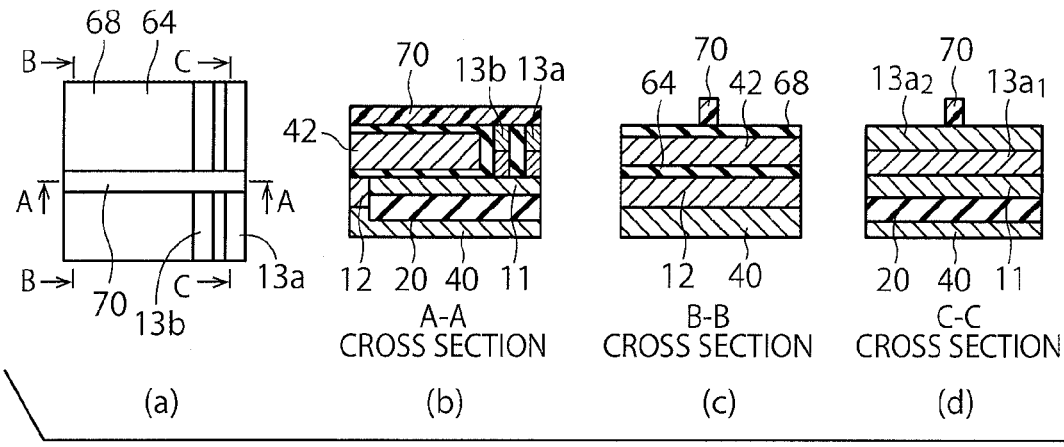
FIGS. 11(a) to 11(d) are diagrams showing the method of manufacturing a magnetic head according to the fourth embodiment.
Figure 12:
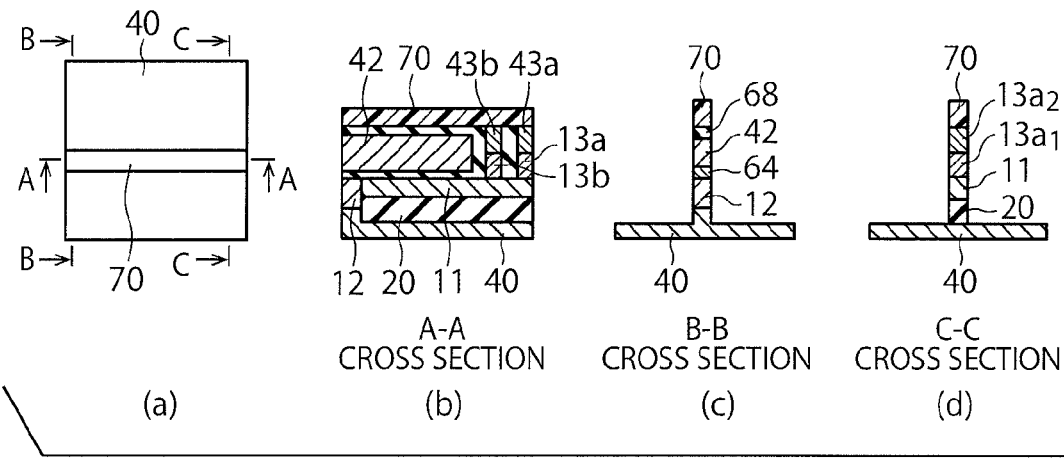
FIGS. 12(a) to 12(d) are diagrams showing the method of manufacturing a magnetic head according to the fourth embodiment.
Figure 13:
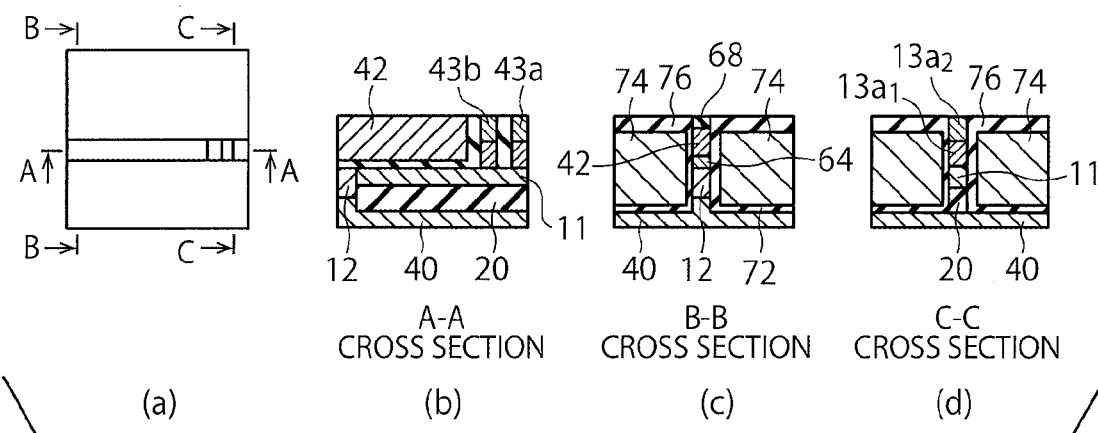
FIGS. 13(a) to 13(d) are diagrams showing the method of manufacturing a magnetic head according to the fourth embodiment.
Figure 14:
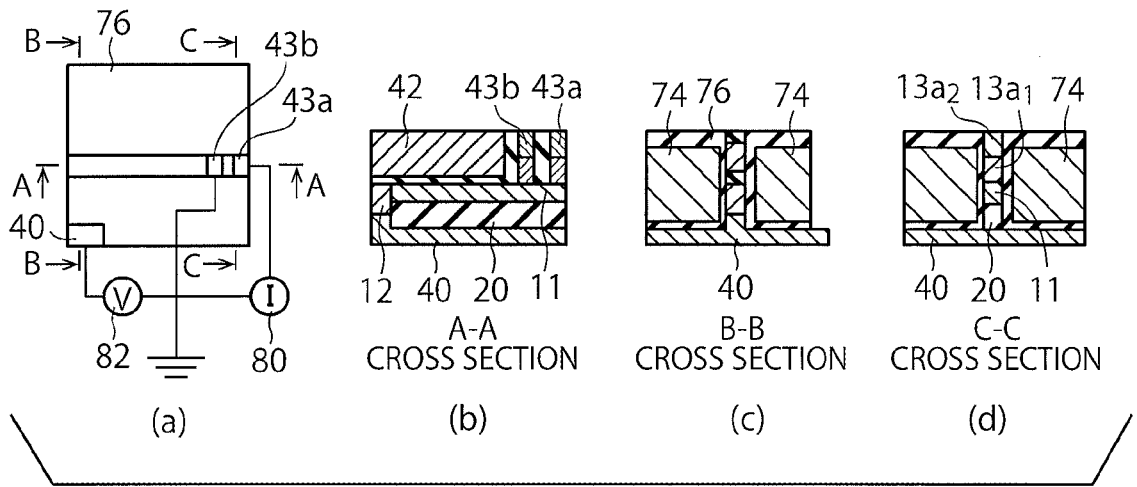
FIGS. 14(a) to 14(d) are diagrams showing the method of manufacturing a magnetic head according to the fourth embodiment.
Figure 15:
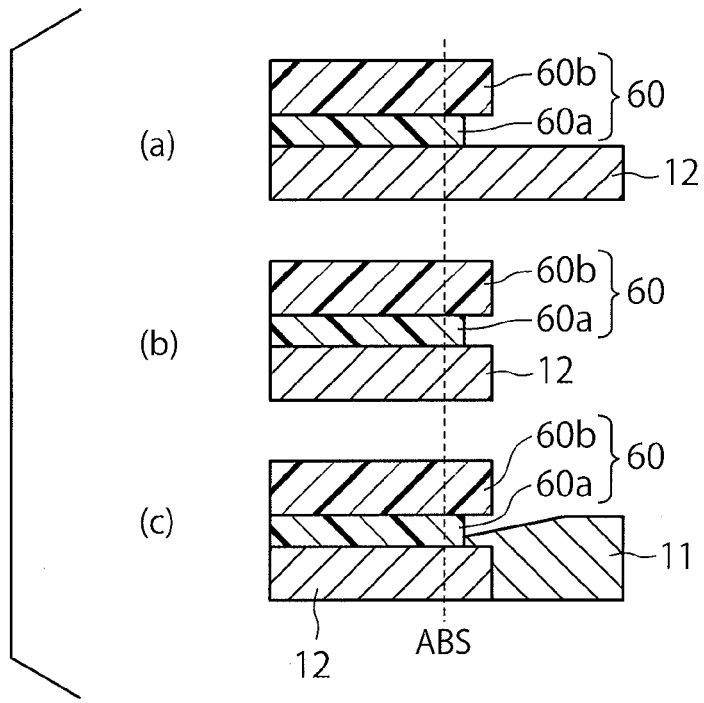
FIGS. 15(a) to 15(c) are cross-sectional views for explaining a method of shaping a nonmagnetic conductive layer around the ABS.

In FIG. 4(a), the nonmagnetic conductive layer 11 is in contact with the second surface 12b of the magnetic layer 12, and decreases in thickness toward the ABS.

In FIG. 4(b), a part of the nonmagnetic conductive layer 11 is in contact with the second surface 12b of the magnetic layer 12, and the nonmagnetic conductive layer 11 is recessed back from the ABS.

In FIG. 4(c), the nonmagnetic conductive layer 11 is in contact with the first surface 12a of the magnetic layer 12, and the volume thereof is reduced to "0" from the first surface 12a to the ABS. This means that the nonmagnetic conductive layer 11 is recessed back from the ABS, and decreases (does not increase) in volume toward the ABS.

In FIG. 4(d), the nonmagnetic conductive layer 11 is in contact with the first surface 12a of the magnetic layer 12, and decreases in thickness toward the ABS. In this example, the first surface 12a of the magnetic layer 12 tilts to the ABS.

In FIG. 4(e), the nonmagnetic conductive layer 11 is in contact with both the first surface 12a and the second surface 12b of the magnetic layer 12, and the volume (thickness) thereof is constant from the first surface 12a toward the ABS. The thickness of the nonmagnetic conductive layer 11 in a region that is in contact with the second surface 12b is thinner than that in the other region. Thus, the nonmagnetic conductive layer 11 decreases (does not increase) in volume toward the ABS.

In FIG. 4(f), the nonmagnetic conductive layer 11 is in contact with both the first surface 12a and the second surface 12b of the magnetic layer 12, and decreases in volume (thickness) from the first surface 12a to the ABS. In the example shown in FIG. 4(f), the region of the nonmagnetic conductive layer 11 in contact with the magnetic layer 12 protrudes, and the thickness of the nonmagnetic conductive layer 11 decreases toward the ABS.

The area of the contact portion between the nonmagnetic conductive layer 11 and the magnetic layer 12 in the examples shown in FIGS. 4(a) to 4(f) is preferably as small as possible in order to increase the output voltage of the magnetic head. All the examples have an effect of narrowing the distance between magnetic shields.

Each of the magnetic layer 2 and the magnetic films $13_1$, $13a_1$, $13a_2$ used in the magnetic head of any one of the first to third embodiments is preferably formed of a metal or alloy containing at least one element selected from the group consisting of, for example, Co, Ni, and Fe. For example, a soft magnetic material such as CoFe, CoNiFe, NiFe, CoZrNb, FeN, FeSi, and FeAlSi, which has a relatively large saturation magnetic flux density, and a magnetic anisotropy in a film in-plane direction, a Heusler alloy selected from the group consisting of CoFeMnSi, CoFeMnGe, CoFeSi, CoFeGe, CoMnSi, CoMnGe, and CoMnAl, or a CoCr-based magnetic alloy in which the magnetization is oriented in the film in-plane direction can be used.

The magnetic layer 12 may include a base layer or a protective layer. The base layer or the protective layer may be formed of a nonmagnetic metal having a low electric resistance, such as Ti, Cu, Ru, Ta, Cr, and Hf. Furthermore, a tunnel barrier layer of MgO, for example, can serve as the base layer.

The antiferromagnetic layers $13_2$, $13a_2$, $13b_2$ may be formed of such materials as IrMn, PtMn, and RhMn.

The magnetic shields 40, 40a, 40b, 42, 42a, 42b, 43, 43a, 43b, 43c may be formed of, for example, a soft magnetic material.

Fourth Embodiment

Next, a method of manufacturing a magnetic head according to a fourth embodiment will be described with reference to FIG. 5(a) to FIG. 15(c). The method according to the fourth embodiment is for manufacturing the magnetic head 1 according to the first embodiment shown in FIG. 1. Top views of the magnetic head 1 in respective manufacturing steps are shown in FIGS. 5(a), 6(a), 7(a), 8(a), 9(a), 10(a), 11(a), 12(a), 13(a), and 14(a). A-A cross-sections of the magnetic head 1 in respective manufacturing steps are shown in FIGS. 5(b), 6(b), 7(b), 8(b), 9(b), 10(b), 11(b), 12(b), 13(b), and 14(b). B-B cross-sections of the magnetic head 1 in respective manufacturing steps are shown in FIGS. 5(c), 6(c), 7(c), 8(c), 9(c), 10(c), 11(c), 12(c), 13(c), and 14(c). C-C cross-sections of the magnetic head 1 in respective manufacturing steps are shown in FIGS. 5(d), 6(d), 7(d), 8(d), 9(d), 10(d), 11(d), 12(d), 13(d), and 14(d).

The A-A cross sections, the B-B cross sections, and the C-C cross sections of the respective steps are taken along lines A-A, B-B, and C-C in the top views of the respective steps.

As shown in FIGS. 5(a) to 5(d), a NiFe layer to become the magnetic shield 40 serving as an electrode is formed by plating on a substrate (not shown). Thereafter, the top surface of the NiFe layer is flattened by chemical mechanical polishing (CMP) to form the magnetic shield 40. Subsequently, a magnetic material layer 12A to become the magnetic layer 12 is deposited on the magnetic shield 40 using a sputtering method, thereby forming a multilayer film. Then, a resist pattern 60 for patterning the magnetic material layer 12A is formed on the magnetic material layer 12A. The resist pattern 60 can be formed by a stepper or nanoimprint, or drawn by electron beams. The resist pattern 60 may be transferred to a hard mask in order to obtain a better aspect ratio in the process.

The magnetic material layer 12A is patterned by ion beam etching (IBE) using the resist pattern 60 as a mask to form the magnetic layer 12 as shown in FIGS. 6(a) to 6(d). The taper angle in the patterning can be adjusted by tilting the ion beams from 0 degree to 70 degrees, 0 degree determined by the direction perpendicular to the top surface of the multilayer film. Generally, tilting toward 0 degree increases the amount of redeposited material, and tilting toward 90 degrees accelerates side etching. In order to obtain the same size as the size of the mask, etching is preferably performed with the taper angle of 50 degrees.

Next, as shown in FIGS. 7(a) to 7(d), an insulating layer 20, the nonmagnetic conductive layer 11, a magnetic material layer 13A, and an antiferromagnetic material layer 13B are sequentially deposited using a sputtering method. Then, the insulating layer 20, the nonmagnetic conductive layer 11, the magnetic material layer 13A, and the antiferromagnetic material layer 13B on the magnetic layer 12 are removed with the resist pattern 60 by a lift-off method. This step may be performed by forming a space on the magnetic layer 12 by depositing a resist pattern 60 including two layers, a resist 60a and a resist 60b, on the magnetic layer 12 as shown in FIGS. 15(a) and 15(c), and then the nonmagnetic conductive layer 11 may be deposited in the space using a sputtering method, chemical vapor deposition (CVD), or atomic layer deposition (ALD). A two-layer resist pattern 60 having an undercut structure may be obtained by using a positive resist to form the resist 60a, which is exposed by using a stepper, and using a resist that is dissoluble in a developer to form the resist 60b. If the nonmagnetic conductive layer 11 is deposited by a sputtering method or CVD, the deposition amount can be adjusted by tilting the deposition angle to the direction of the stacking surface. The various shapes shown in FIGS. 4(a) to 4(f) can be obtained by adjusting the degree of undercut and the position of the ABS. In this manner, the structures can be obtained, in each of which the nonmagnetic conductive layer 11 decreases in volume toward the ABS.

Next, resist patterns 62a, 62b for forming the magnetic layers 13a, 13b shown in FIG. 1 are formed, as shown in FIGS. 8(a) to 8(d).

Subsequently, the antiferromagnetic material layer 13B and the magnetic material layer 13A are patterned by an IBE method using the resist patterns 62a, 62b as masks, thereby forming the magnetic layers 13a, 13b as shown in FIGS. 9(a) to 9(d). The magnetic layer 13a includes the magnetic film $13a_1$ and the antiferromagnetic film $13a_2$, and the magnetic layer 13b includes the magnetic film $13b_1$ and the antiferromagnetic film $13b_2$.

Thereafter, an interlayer insulating film 64, a magnetic shield material layer 66, and an interlayer insulating film 68 are deposited, and the interlayer insulating film 64, the magnetic shield material layer 66, and the interlayer insulating film 68 on the resist patterns 62a, 62b are removed by a lift-off method as shown in FIGS. 10(a) to 10(d).

Then, a mask 70 for patterning the nonmagnetic conductive layer 11 is formed as shown in FIGS. 11(a) to 11(d), and the interlayer insulating film 68, the magnetic shield material layer 66, the interlayer insulating film 64, the nonmagnetic conductive layer 11, and the insulating film 20 are patterned by an IBE (Ion Beam Etching) method using the mask 70 as shown in FIGS. 12(a) to 12(d) to expose the top surface of the magnetic shield 40. As a result, the magnetic shields 42, 43 are formed.

Next, an interlayer insulating film 72, a hard bias film 74, and an interlayer insulating film 74 are sequentially deposited as shown in FIGS. 13(a) to 13(d), and the interlayer insulating film 72, the hard bias film 74, and the interlayer insulating film 74 on the mask 70 are removed by a lift-off method. A constant bias magnetic field is preferably applied to the hard bias film 74 to stabilize the state of magnetization in the magnetic layer 12. The hard bias film 74 may be formed of CoPt, which has a high in-plane coercive force, or an alloy containing CoPt.

Finally, a wiring line for forming a contact is formed through the magnetic shields 40, 43a, 43b as shown in FIGS. 14(a) to 14(d), and the current source 80 and the voltmeter 82 are connected to the circuit. The contact hole pattern for forming the wiring line to the magnetic shield 40 can be made by forming a resist mask using a stepper, and etching the shields by IBE.

Fifth Embodiment

A magnetic recording and reproducing apparatus according to a fifth embodiment will be described.

The magnetic head according to any of the first to the third embodiments described above can be incorporated into, for example, a recording and reproducing type magnetic head assembly, and further incorporated into a magnetic recording and reproducing apparatus (HDD). The magnetic recording and reproducing apparatus according to the fifth embodiment may have a reproducing function, and may have both a recording function and a reproducing function.

Figure 16:
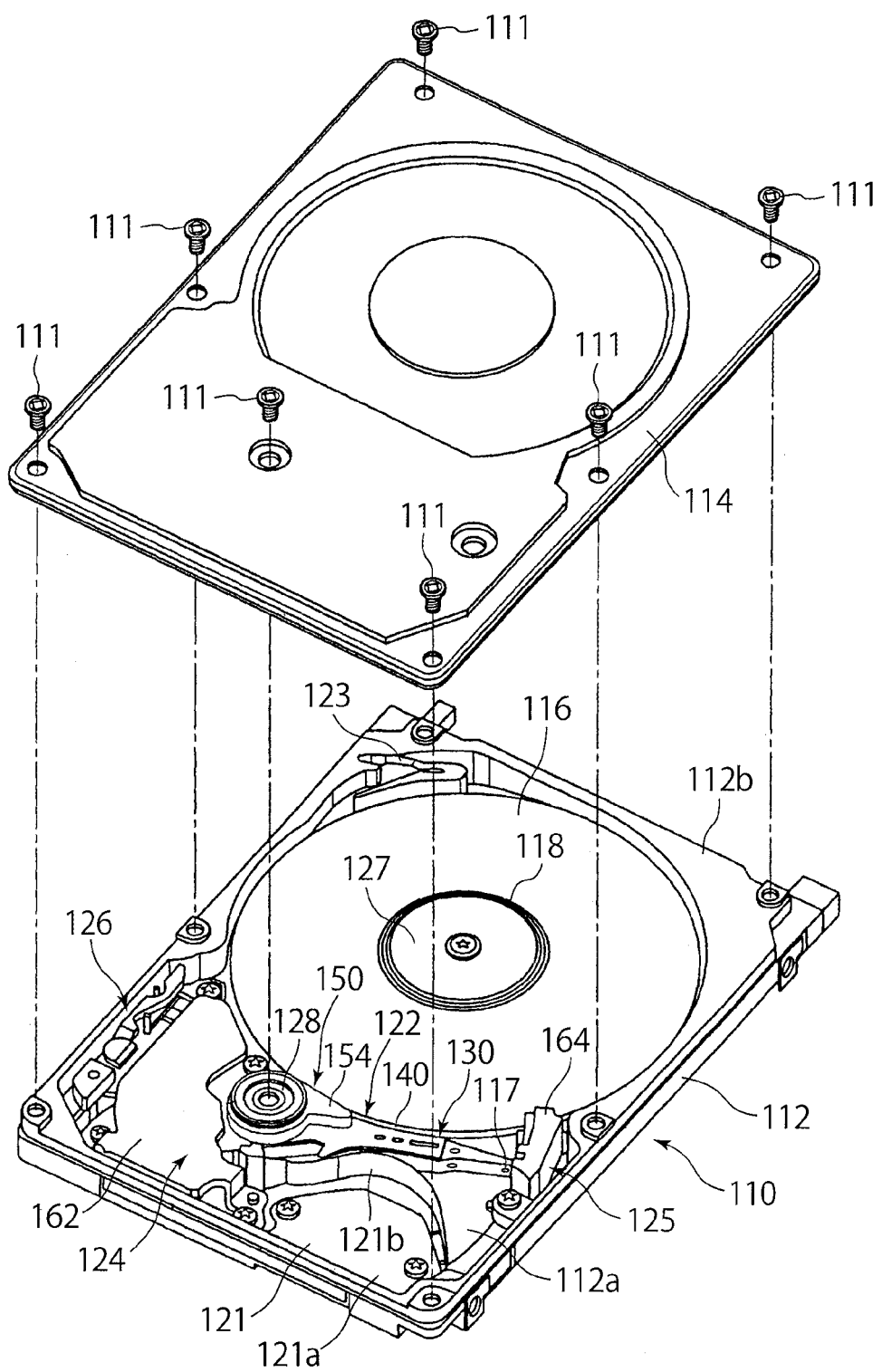
FIG. 16 is a perspective view showing a structure of a magnetic recording and reproducing apparatus according to a fifth embodiment.

FIG. 16 is a perspective view showing a structure of the magnetic recording and reproducing apparatus according to the fifth embodiment. As shown in FIG. 16, the magnetic recording and reproducing apparatus includes a housing 110. The housing 110 includes a base 112 in a rectangular box shape, of which the top surface is open, and a top cover 114 to be fastened to the base 112 by a plurality of bolts 111 to close the opening on the top surface of the base 112. The base 112 includes a bottom plate 112a in a rectangular shape, and a sidewall 112b standing along the periphery of the bottom plate 112a.

The housing 110 houses a magnetic disk 116 serving as a recording medium, and a spindle motor 118 serving as a driving unit for supporting and rotating the magnetic disk 116. The spindle motor 118 is disposed on the bottom plate 112a. The housing 110 has a size enabling the housing of plural, for example two, magnetic disks, and the spindle motor 118 is capable of supporting and driving two magnetic disks.

The housing 110 also houses a plurality of magnetic heads 117 for recording information to and reproducing information from the magnetic disk 116, a head stack assembly ("HSA") 122 for supporting the magnetic heads 117 so as to be freely moved relative to the magnetic disk 116, a voice coil motor ("VCM") 124 for pivoting and positioning the HSA 122, a ramp loading mechanism 125 for moving and holding the magnetic head 117 at a retracting position that is at a distance from the magnetic disk 116 when the magnetic head 117 reaches the outermost portion of the magnetic disk 116, a latch mechanism 126 for holding the HSA 122 at the retreating position when an impact is given to the HDD, and a substrate unit 121 including a preamplifier. A printed circuit board that is not shown is fastened by bolts to the outer surface of the bottom plate 112a of the base 112. The printed circuit board controls operations of the spindle motor 118, the VCM 124, and the hard disk heads 117 via the substrate unit 121. A circulation filter 123 for capturing dusts within the housing by driving a movable portion thereof is provided to a sidewall of the base 112 at a position outside the magnetic disk 116.

The magnetic disk 116 has a diameter of, for example, 65 mm (2.5 inches), and includes magnetic recording layers on the top surface and the bottom surface. The magnetic disk 116 is coaxially engaged with a hub (not shown) of the spindle motor 118, and clamped by a clamp spring 127 to be fixed to the hub. In this manner, the magnetic disk 116 is supported to be in parallel with the bottom plate 112a of the base 112. The magnetic disk 116 is rotated by the spindle motor 118 at a predetermined speed, for example, 5400 rpm or 7200 rpm.

Figure 17:
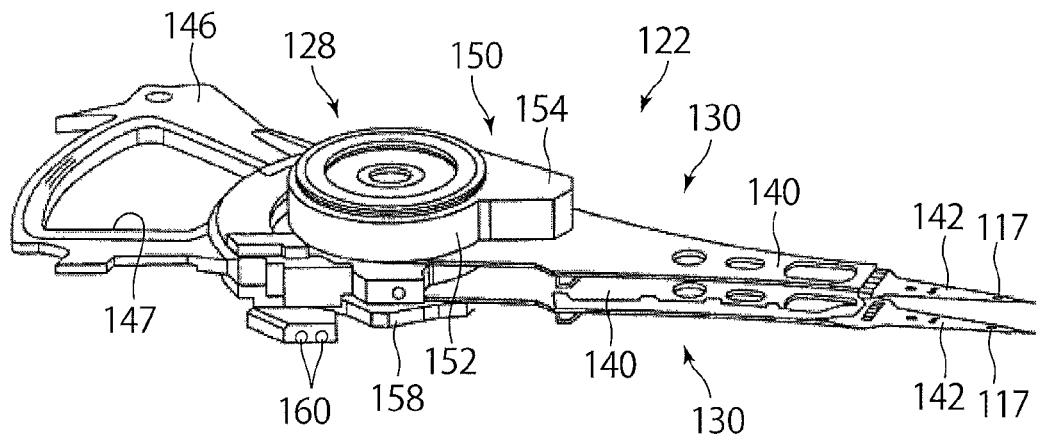
FIG. 17 is a perspective view of a head stack assembly.
Figure 18:
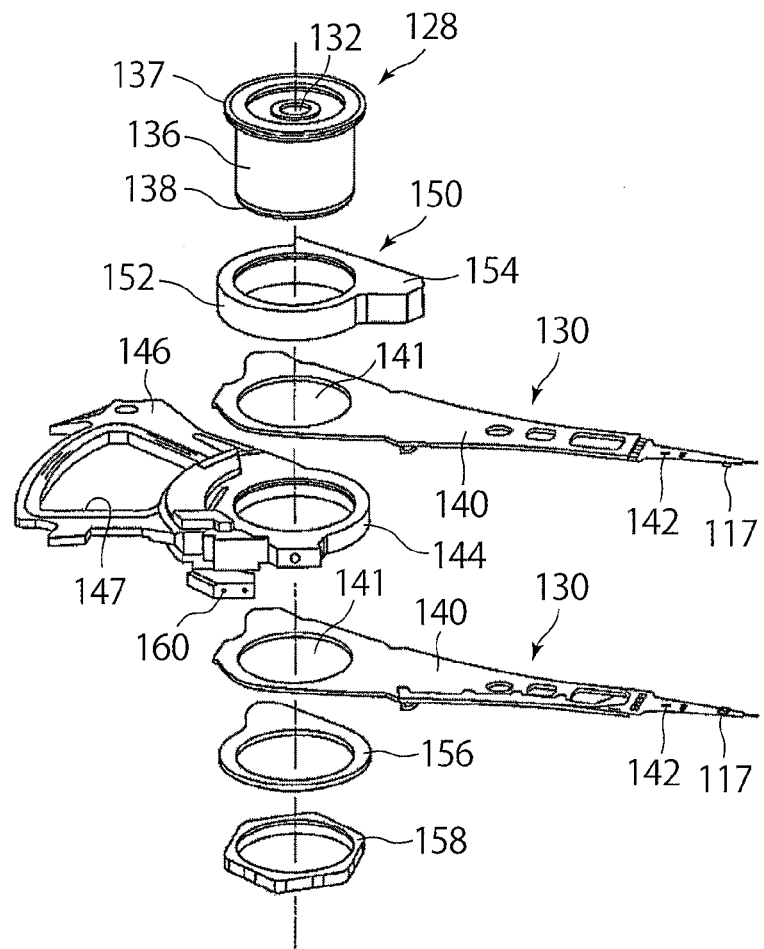
FIG. 18 is an exploded perspective view of a head stack assembly.

FIG. 17 is a perspective view showing the head stack assembly (HSA) 122 of the magnetic recording and reproducing apparatus according to the fifth embodiment, and FIG. 18 is an exploded perspective view of the HSA 122. As shown in FIGS. 17 and 18, the HSA 122 includes a bearing unit 128 that can be freely rotated, two head gimbal assemblies ("HGAs") 130 extending from the bearing unit 128, a spacer ring 144 disposed within the HGAs 130, and a dummy spacer 150.

The bearing unit 128 is located along the longitudinal direction of the base 112 at a distance from the rotation center of, and near the outer periphery of the magnetic disk 116. The bearing unit 128 includes a pivot axis 132 standing on the bottom plate 112a of the base 112, and sleeve 136 in a cylindrical shape, which is coaxially supported by the pivot axis 132 so as to be rotated freely around the pivot axis 132 via the bearings 134. A flange 137 in a ring shape is disposed on the upper portion of the sleeve 136, and a screw portion 138 is formed on the outer periphery of the lower portion. The sleeve 136 of the bearing unit 128 has a size, i.e., a length in the axial direction, sufficiently enough to fix at maximum of four HGAs 140, for example, and spacers between the adjacent HGAs 140.

In the fifth embodiment, the number of magnetic disk 116 is one. Accordingly, two HGAs 130, which are fewer than the maximum attachable number of four, are fixed to the bearing unit 128. Each HGA 130 includes an arm 140 extending from the bearing unit 128, a suspension 142 extending from the arm, and a hard disk head 117 supported at the extended end of the suspension via a gimbal portion.

The arm 140 has a laminate structure of, for example, stainless steel, aluminum, and stainless steel, and in a thin flat plate shape. A circular through-hole 141 is formed on one end, i.e., the base end thereof. The suspension 142 is formed of a narrow and long leaf spring, the base portion of which is fixed to an end of the arm 140 by spot welding or gluing so that the suspension 142 extends from the arm 140. The suspension 142 and the arm 140 may be integrally formed of the same material.

The magnetic head 117 is one of the magnetic heads according to the first to the third embodiments, and includes a substantially rectangular slider (not shown) and a recording head formed on the slider. The magnetic head 117 is fixed to the gimbal portion formed at a tip portion of the suspension 142. Furthermore, the magnetic head 117 includes four electrodes, which are not shown. A relay flexible printed circuit board ("relay FPC") is disposed on the arm 140 and the suspension 142, and the magnetic head 117 is electrically connected to a main FPC 121b via the relay FPC.

The spacer ring 144 is formed of aluminum or the like to have a predetermined thickness and a predetermined outside diameter. A support frame 146 of a synthetic resin is integrally formed with the spacer ring 144 and extends outwardly from the spacer ring. A voice coil 147 of the VCM 124 is fixed to the support frame 146.

The dummy spacer 150 includes a spacer body 152 in an annular shape, and a balance adjusting portion 154 extending from the spacer body. The dummy spacer 150 is integrally formed of a metal such as stainless steel. The outside diameter of the spacer body 152 is the same as that of the spacer ring 144. Therefore, the outside diameter of a portion of the spacer body 152 contacting the arm is the same as the outside diameter of a portion of the spacer ring 144 contacting the arm. The thickness of the spacer body 152 is the sum of the thicknesses of the arms of the HGAs, the number of which is fewer than the maximum number, two in this case, and the thicknesses of the spacer rings disposed therebetween.

The dummy spacer 150, the two HGAs 130, and the spacer ring 144 are engaged with the outer periphery of the sleeve 136 of the bearing unit 128 with the sleeve 136 being inserted into the inner hole of the spacer body 152, the through-hole 141 of the arm 140, and the inner hole of the spacer ring. Thus, the dummy spacer 150, the two HGAs 130, and the spacer ring 144 are stacked on the flange 137 along the axial direction of the sleeve. The spacer body 152 of the dummy spacer 150 is engaged with the outer periphery of the sleeve 136 so as to be disposed between the flange 137 and one of the arms 140, and the spacer ring 144 is engaged with the outer periphery of the sleeve 136 so as to be disposed between the two arms 140. A washer 156 in an annular shape is engaged with the lower periphery of the sleeve 136.

The dummy spacer 150, the two arms 140, the spacer ring 144, and the washer 156 engaged with the outer periphery of the sleeve 136 are sandwiched between a nut 158 engaged with the screw portion 138 of the sleeve 136 and the flange 137 to be fixed to the outer periphery of the sleeve.

The two arms 140 are located at predetermined positions in the circumferential direction of the sleeve 136, and extend in the same direction from the sleeve. As a result, the two HGAs are integrally rotated with the sleeve 136, and face each other with a predetermined distance therebetween in parallel with the surface of the magnetic disk 116. The support frame 146 integrally formed with the spacer ring 144 extends from the bearing unit 128 in the opposite direction to the arms 140. Two terminals 160 in a pin shape project from the support frame 146, and electrically connect to the voice coil 147 via a wiring (not shown) embedded in the support frame 146.

The suspension 142 has lead lines (not shown) for writing and reading signals, which are connected to respective electrodes of the magnetic head incorporated into the slider. Furthermore, an electrode pad (not shown) is provided to the magnetic head assembly 130.

A signal processing unit (not shown) for writing signals to and reading signals from the magnetic recording medium using the magnetic head is provided. The signal processing unit is disposed on the back side of the magnetic recording and reproducing apparatus shown in FIG. 16. The input and output lines of the signal processing unit are connected to the electrode pad and electrically coupled to the magnetic head.

Thus, the magnetic recording and reproducing apparatus according to the fifth embodiment includes a magnetic recording medium, any of the magnetic heads according to the first to the third embodiment, a movable unit (movement controller) for separating the magnetic recording medium and the magnetic head from each other, or moving the magnetic recording medium and the magnetic head relative to each other under a contact state, a position controller for positioning the magnetic head at a predetermined recording position of the magnetic recording medium, and a signal processing unit for writing signals to and reading signals from the magnetic recording medium using the magnetic head. The recording medium disk 116 can be used as the aforementioned magnetic recording medium. The aforementioned movable unit may include a slider. Furthermore, the aforementioned position controller may include an HSA 122.

When the magnetic disk 116 is rotated, and the actuator arm 140 is caused to pivot by the voice coil motor 124 to load the slider onto the magnetic disk 116, the air bearing surface (ABS) of the magnetic head of the slider is held above the surface of the magnetic disk 116 at a predetermined floating distance therefrom. In this manner, the information recorded on the magnetic disk 116 is read based on the aforementioned principle.

The magnetic recording and reproducing apparatus according to the fifth embodiment, which uses any of the magnetic heads according to the first to the third embodiments, is capable of increasing the output voltage, and narrowing the gap between shields.

An example will be described below.

Example

Figure 19:
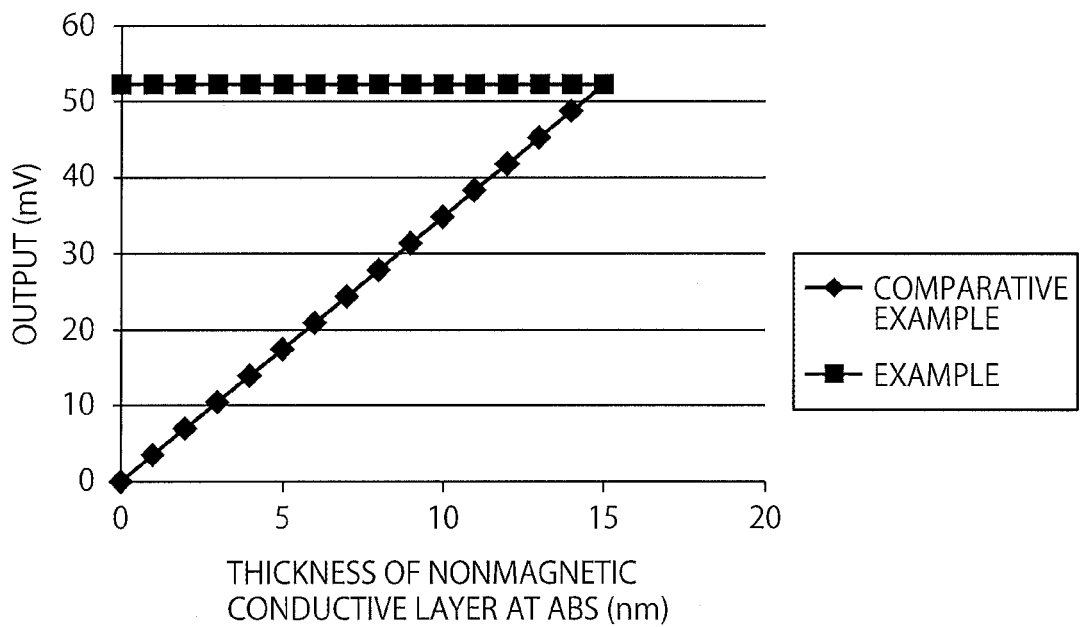
FIG. 19 is a diagram showing the relationship between the thickness of a nonmagnetic conductive layer at the ABS and the output when the current density is fixed.
Figure 20:
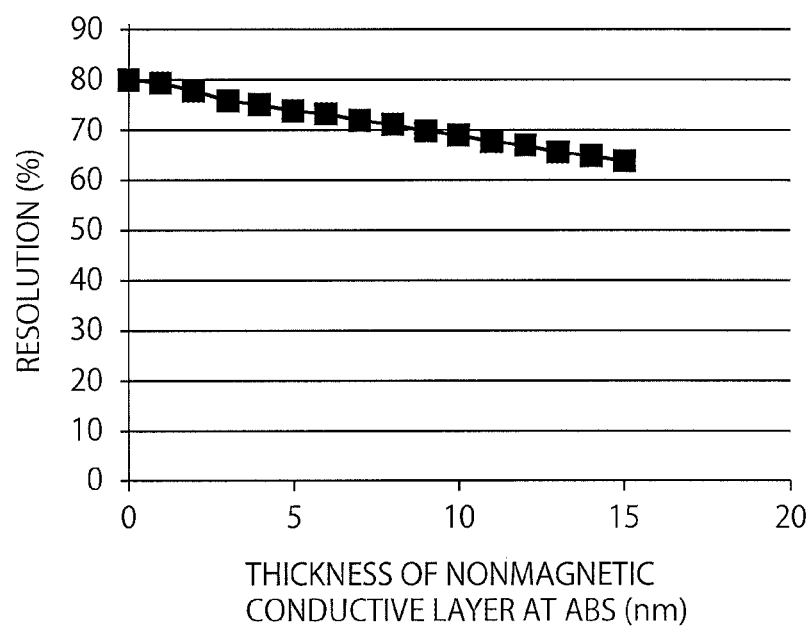
FIG. 20 is a diagram showing the relationship between the thickness of a nonmagnetic conductive layer at the ABS and the resolution when the current density is fixed.

The magnetic head 1 according to an Example of the first embodiment, including the nonmagnetic conductive layer 11 that decreases in thickness toward the ABS as shown in FIG. 4(a), is manufactured according to the method of the fourth embodiment. The thickness of the nonmagnetic conductive layer 11 on the side of the magnetic layers 13a, 13b is fixed to 15 nm, and the thickness of the nonmagnetic conductive layer 11 near the ABS is changed from 15 nm to 0 nm. Non-local voltage measurement is performed by using the magnetoresistive element 10 having the spin accumulation function with the sense current amount adjusted, and the current density fixed at $5 \times 10^7$ A/cm². As a result, a potential difference $\Delta V$ that is dependent on relative magnetization directions of the magnetic layer 12 and the magnetic layer 13b can be obtained. This potential difference $\Delta V$ is called "output voltage." FIG. 19 shows the dependence of the output voltage $\Delta V$ on the thickness of the nonmagnetic conductive layer 11. It could be understood from FIG. 19 that regardless of the thickness of the nonmagnetic conductive layer 11 at the ABS, the output voltage of 50 mV or more can always be obtained. FIG. 20 shows a result of measuring resolution (HF output/LF output) using a spin stand microscopy on a condition of 1320 kFCI. The resolution in a case where the thickness of the nonmagnetic conductive layer 11 at the ABS remains 15 nm is 64% while the resolution in a case where the thickness of the nonmagnetic conductive layer 11 at the ABS is 0 nm is 80%. Thus, a gain of 16% can be obtained.

Comparative Examples

As Comparative Examples, magnetic heads having the same structure as the Example except that the thickness of the nonmagnetic conductive layer 11 is constant are prepared in the same manner as preparing the Example. The thicknesses of the nonmagnetic conductive layers 11 of the magnetic heads prepared vary in a range of less than or equal to 15 nm. The amount of sense current is adjusted, and the current density is fixed to $5 \times 10^7$ A/cm². A non-local voltage is performed by using the magnetoresistive elements having a spin accumulation effect. FIG. 19 shows the output voltages obtained. It can be understood from FIG. 19 that as the nonmagnetic conductive layer has a smaller thickness, the output thereof decreases.

From the foregoing, it can be confirmed that a magnetic head having a spin accumulation effect, which has a narrowed gap between shields with the output voltage maintained, can be obtained by decreasing the thickness of the nonmagnetic conductive layer 11 toward the ABS.

Furthermore, it can be confirmed that if the output is the same, a better gain of resolution can be obtained when the volume of the nonmagnetic conductive layer 11 is reduced toward the ABS.

A magnetic head according to an embodiment comprises: a magnetoresistive element described above; and a magnetic shield disposed on an opposite side of the nonmagnetic conductive layer to the first magnetic layer, in the direction along which the nonmagnetic conductive layer extends, the magnetic shield projecting toward the nonmagnetic conductive layer near the one face of the nonmagnetic conductive layer.

The magnetic head comprises the magnetoresistive element as a reproducing element.

A magnetic recording and reproducing apparatus according to an embodiment comprises: a magnetic recording medium; a magnetic head described above; a movement controller that controls relative movements of the magnetic recording medium and the magnetic head so that they move relative to each other on a floating or contacting state, facing each other; a position controller that controls a position of the magnetic head so as to be at a predetermined position of the magnetic recording medium; and a signal processing unit that processes a write signal to the magnetic recording medium and a read signal from the magnetic recording medium using the magnetic head.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a nonmagnetic conductive layer having two end faces in a direction along which the nonmagnetic conductive layer extends;
   a first magnetic layer connected to the nonmagnetic conductive layer near one end face of the two end faces;
   a second magnetic layer connected to the nonmagnetic conductive layer so as to be distant from the first magnetic layer in the direction;
   a third magnetic layer connected to the nonmagnetic conductive layer so as be distant from the first magnetic layer in the direction;
   a first magnetic electrode connected to the first magnetic layer;
   a second magnetic electrode connected to the second magnetic layer; and
   a third magnetic electrode connected to the third magnetic layer, a voltage being applied between the third magnetic electrode and the first magnetic electrode through the third magnetic layer, the nonmagnetic conductive layer, and the first magnetic layer, and a current being caused to flow between the third electrode and the second magnetic electrode through the third magnetic layer, the nonmagnetic conductive layer, and the second magnetic layer,
   the nonmagnetic conductive layer decreasing in volume toward the one end face.

2. The element according to claim 1, wherein the first magnetic layer and the second magnetic layer are disposed on opposite sides of the nonmagnetic conductive layer, and the third magnetic layer is disposed on the same side as the second magnetic layer on the nonmagnetic conductive layer.

3. The element according to claim 1, wherein:
   the first magnetic layer has a first surface, a second surface that is opposed to the first surface, and a third surface that is different from the first surface and the second surface; and
   the nonmagnetic conductive layer is connected to at least one of the second surface and the third surface of the first magnetic layer.

4. The element according to claim 3, wherein:
   the nonmagnetic conductive layer is connected to the third surface of the first magnetic layer; and
   the nonmagnetic conductive layer decreases in thickness from the second surface to the first surface, or the one face of the nonmagnetic conductive layer is recessed in a direction from the first surface to the second surface.

5. The element according to claim 3, wherein the one face of the nonmagnetic conductive layer is connected to the second surface of the first magnetic layer.

6. The element according to claim 5, wherein the second surface of the first magnetic layer is tilted relative to the first surface.

7. The element according to claim 3, wherein the nonmagnetic conductive layer is connected to the second surface and the third surface of the first magnetic layer.

* * * * *